(12) United States Patent
Shin

(10) Patent No.: US 7,741,179 B2
(45) Date of Patent: Jun. 22, 2010

(54) METHOD OF MANUFACTURING FLASH SEMICONDUCTOR DEVICE

(75) Inventor: Hyun-Soo Shin, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 266 days.

(21) Appl. No.: 11/781,591

(22) Filed: Jul. 23, 2007

(65) Prior Publication Data

US 2008/0017910 A1    Jan. 24, 2008

(30) Foreign Application Priority Data

Jul. 24, 2006    (KR)    ........................ 10-2006-0069029

(51) Int. Cl.
*H01L 21/336*    (2006.01)
*H01L 29/788*    (2006.01)

(52) U.S. Cl. ...................................... 438/262; 257/318

(58) Field of Classification Search ......... 438/257–262, 438/287, 294; 257/333, 389, E21.62, 317–322
See application file for complete search history.

(56) References Cited

U.S. PATENT DOCUMENTS

| 6,583,046 | B1 * | 6/2003 | Okada et al. ................ 438/622 |
| 7,445,998 | B2 * | 11/2008 | Young et al. ................ 438/261 |
| 2005/0145920 | A1 * | 7/2005 | Chang et al. ................ 257/315 |
| 2007/0010056 | A1 * | 1/2007 | Kim ........................... 438/257 |

\* cited by examiner

*Primary Examiner*—Calvin Lee
(74) *Attorney, Agent, or Firm*—Sherr & Vaughn, PLLC

(57) ABSTRACT

A method of manufacturing a flash semiconductor device minimizes a loss of dopant caused by dopant out-diffusion. A trench is formed in a semiconductor substrate. At least one poly gate is formed in the semiconductor substrate including the trench. An RCS (Recess Common Source) region is formed in the trench. Dopant ions are implanted into the RCS region, and an annealing process is applied to the RCS region.

9 Claims, 5 Drawing Sheets

METHOD OF MANUFACTURING FLASH SEMICONDUCTOR DEVICE

The present application claims priority under 35 U.S.C. 119 to Korean Patent Application No. 10-2006-0069029, filed on Jul. 24, 2006, which is hereby incorporated by reference in its entirety.

BACKGROUND

In general, a flash memory is one kind of PROM (programmable read only memory) which enables data to be electrically rewritten. The flash memory corresponds to a nonvolatile memory whose data is not lost even when power is turned off.

Based on cell-array architecture, flash memory may have a NOR-type structure where cells are arranged in parallel between a bit line and a ground. Flash memory may also have a NAND-type structure where cells are arranged in series. The NOR-type flash memory has a parallel structure and may be used for booting a mobile phone since it provides relatively high-speed random access reading operations. The NAND-type flash memory provides relatively lower reading speeds, but relatively higher writing speeds. In this respect, the NAND-type flash memory may be more appropriate for data storage. It may also be capable of a greater degree of miniaturization.

Flash memory may be classified into as stack gate type or split gate type on the basis of the unit cell structure. Based on the type of charge storage layer used, the flash memory may also be classified as a floating gate device or a silicon-oxide-nitride-oxide-silicon (SONOS) device. The floating gate device includes a floating gate which may be formed by polysilicon covered with an insulator. Charges may be injected to or discharged from the floating gate by a channel hot carrier injector or F-N (Fowler-Nordheim) tunneling, so that data is stored in and erased from the floating gate.

A method of manufacturing the NOR-type floating gate device may include controlling a cell threshold voltage by forming a stack gate, including a floating gate, an insulation layer between gates (for example, Oxide-Nitride-Oxide ONO layer), and a control gate. An SAS (Self-Aligned Source) process may be used to form a common source line.

An SAS process may be performed to decrease a cell dimension along the direction of a word line. In an SAS process, a field oxide layer is etched at an etching selection ratio of a polysilicon layer for a gate electrode, a silicon substrate and a field oxide layer, and then impurity ions are implanted thereto, thereby forming the common source line.

Figure 1A:
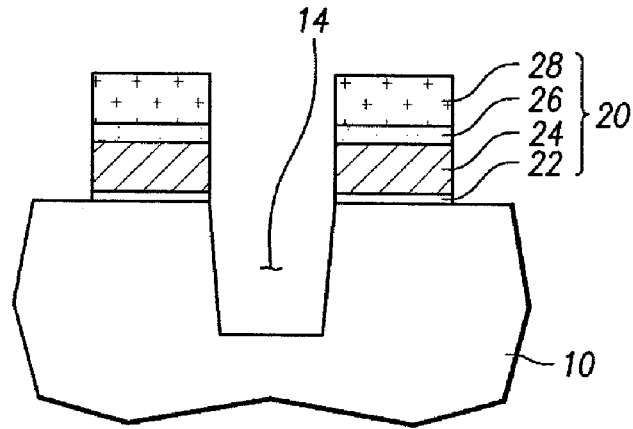
Figure 1B:
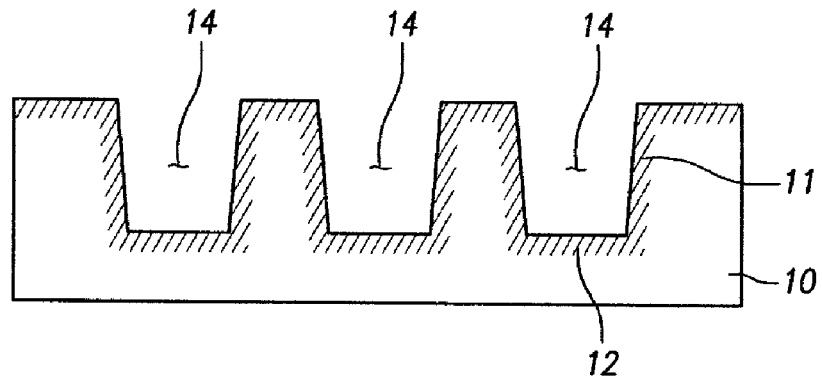
Figure 1C:
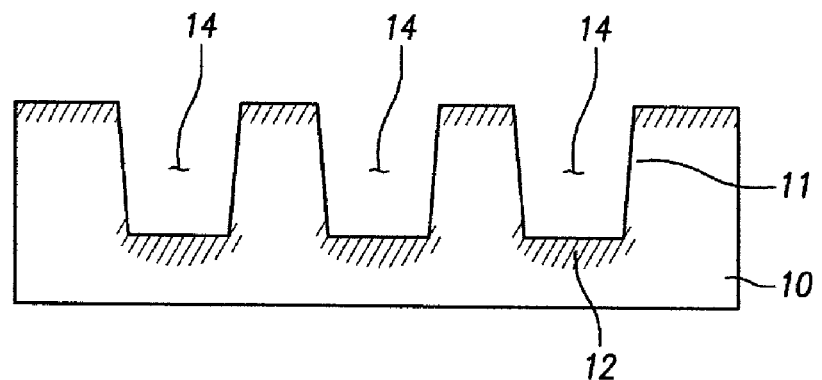

Referring to FIGS. 1A to 1C, SAS process according to the related art will be briefly explained. In FIG. 1A, a stack gate 20 is formed including a tunnel oxide layer 22, a floating gate 24, a gate dielectric layer 26 and a control gate 28. Through the SAS process, a source region for 8 to 16 bit cell is opened, and an oxide layer is removed from a device isolation region. The oxide layer formed in the device isolation region corresponds to a field oxide layer formed by STI (Shallow Trench Isolation). By removing the oxide layer, a trench 14 is formed in a common source region, which is a region for a common source line exposed between each stack gate 20.

Then, dopant ions (As or P) are implanted into the surface of the exposed substrate, forming an ion-implantation layer. The ion implantation layer serves as the common source line 11, 12, which electrically connects source diffusion regions of respective cells.

FIG. 1B is a cross sectional view illustrating dopant diffused in the common source region according to the related art. Due to the trench 14 formed by the SAS process, the substrate 10 has an uneven surface.

However, in semiconductor device processes below 0.13 μm, if dopant (As or P) ions are implanted using the SAS process, dopant out-diffusion occurs in the lateral common source line 11. There is a loss of dopant, making it difficult to lower a resistance value (Rs) in the common source line.

SUMMARY

An object of the embodiments is to provide a method of manufacturing a flash semiconductor device to minimize a loss of dopant caused by dopant out-diffusion. A method of manufacturing a flash semiconductor device includes forming a trench in a semiconductor substrate. At least one poly gate is formed in the semiconductor substrate including the trench. An RCS (Recess Common Source) region is formed in the trench. A dopant ion-implantation is performed in the RCS region. An annealing process is then applied to the RCS region in which ions have been implanted.

The trench may be formed by STI (Shallow Trench Isolation). The gate poly may include a tunnel oxide layer, a floating gate, an ONO (Oxide-Nitride-Oxide) layer and a control gate.

Forming the RCS region may include coating the other regions except the trench with photoresist. A pattern may be formed corresponding to the gate poly. An etching process may be performed using the pattern as an etching mask. The photoresist may be removed, for example, by an ashing process using $H_2$ plasma gas.

The dopant ion-implantation may be performed using p-type dopant including As. The annealing process may use an RTP (Rapid Thermal Process), for example using $N_2$ gas maintained for 10 seconds at a temperature between 800° C. and 1050° C.

DRAWINGS

Example FIG. 1A is a cross sectional view of a flash memory device in a related art SAS (Self-Aligned Source) process.

Example FIG. 1B is a cross sectional view of dopant diffused in a common source region according to the related art.

Example FIG. 1C is a cross sectional view of dopant out-diffusion in a common source region according to the related art.

Figure 2:
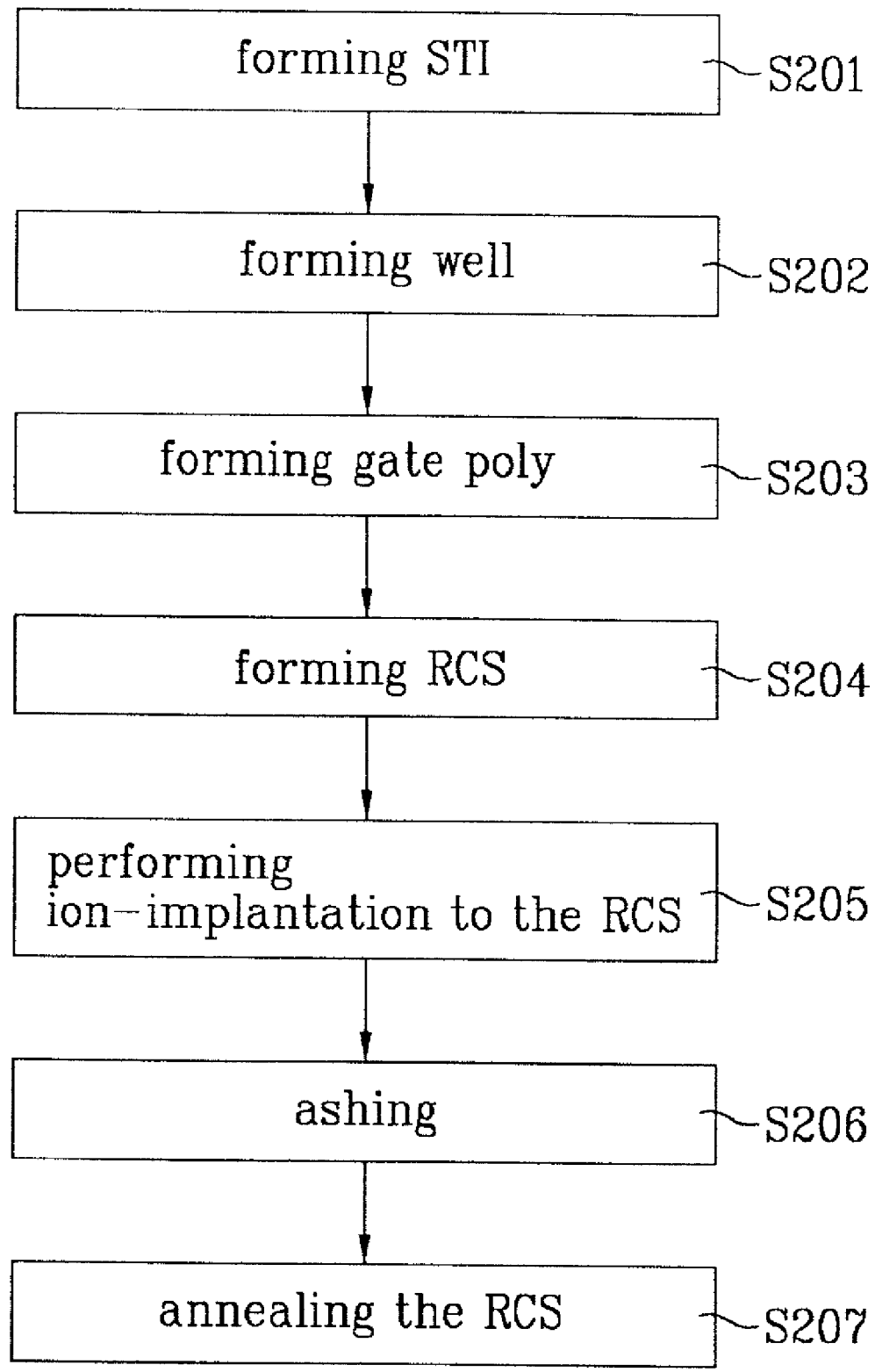

Example FIG. 2 is a flow chart of an RCS process according to embodiments.

Example FIGS. 3A to 3D are cross sectional views of a method of manufacturing a flash semiconductor device according to embodiments.

Figure 4:
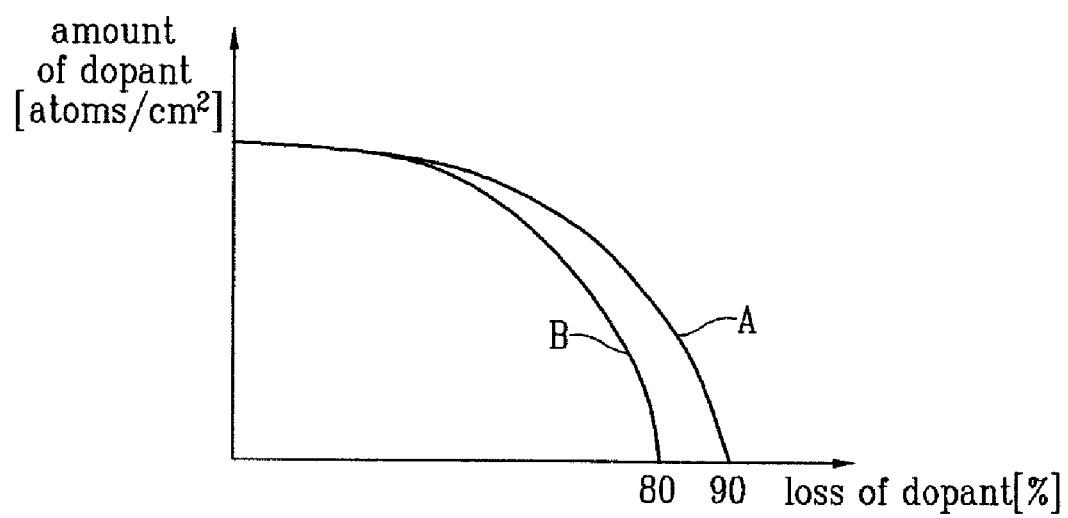

Example FIG. 4 is a graph illustrating the efficacy of dopant in a flash semiconductor device by an RCS process according to embodiments.

DESCRIPTION

As shown in FIG. 2, an RCS (recessed common source) process is performed. An STI (shallow trench isolation) may be used to define an active area and a field area in a substrate 100 (S201).

Figure 3A:
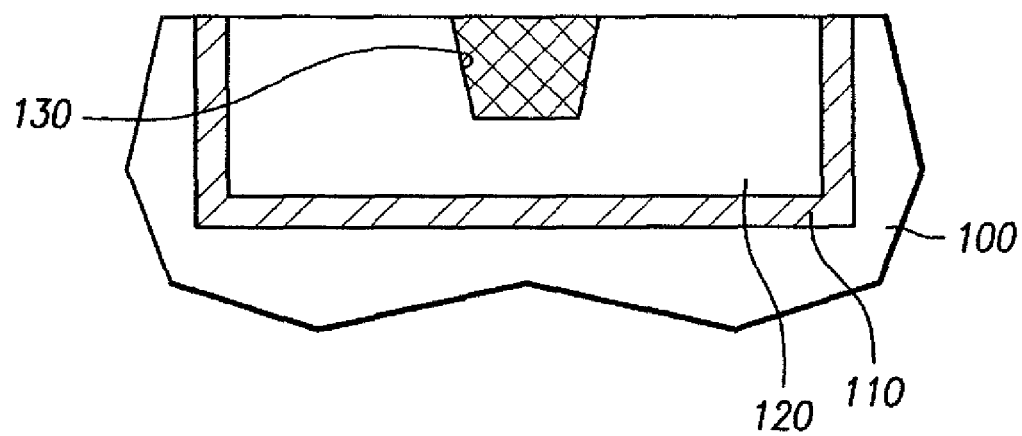

Referring to FIG. 3A, a trench 130 may form a device isolation layer. The trench 130 may be formed by a general STI process.

After forming the trench 130, an ion-implantation process may be performed on the substrate 100, to form wells 110 and 120 (S202). If the substrate 100 corresponds to a p-type substrate, N-well 110 and P-well 120 may be formed. For example, the N-well 110 may be formed by an ion-implantation process using phosphorus (P), and the P-well 120 may be formed by an ion-implantation process using boron (B).

Figure 3B:
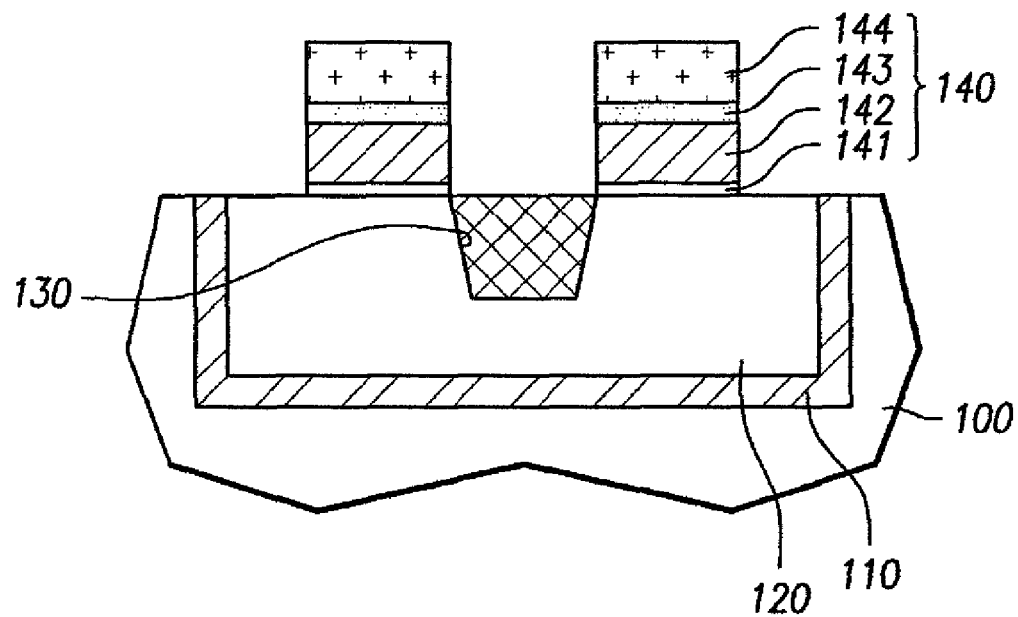

As shown in FIG. 3B, a gate poly 140 may be formed at each side of the trench 130 (S203). A tunnel oxide layer 141 may be deposited. In use, electrons pass through the tunnel oxide layer 141 to store and erase data in a memory cell. A polysilicon may be deposited over the tunnel oxide layer 141, to form a floating gate 142. An interpoly insulation layer, for example, ONO (Oxide-Nitride-Oxide) layer 143 may be formed. Subsequently, a control gate 144 may be formed by using, for example, a polysilicon layer, wherein the control gate 144 functions as a ward line and a selection line. In order to improve the conductivity of the control gate 144, a tungsten silicide (WSix) layer may be stacked over the control gate 144.

The tunnel oxide layer 141, the floating gate 142, the ONO layer 143 and the control gate 144 constitute one gate poly 140. The gate poly 140 is formed in a direction of a bit line of a memory device. A plurality of gate poly 140 structures may be formed at a fixed interval.

Figure 3C:
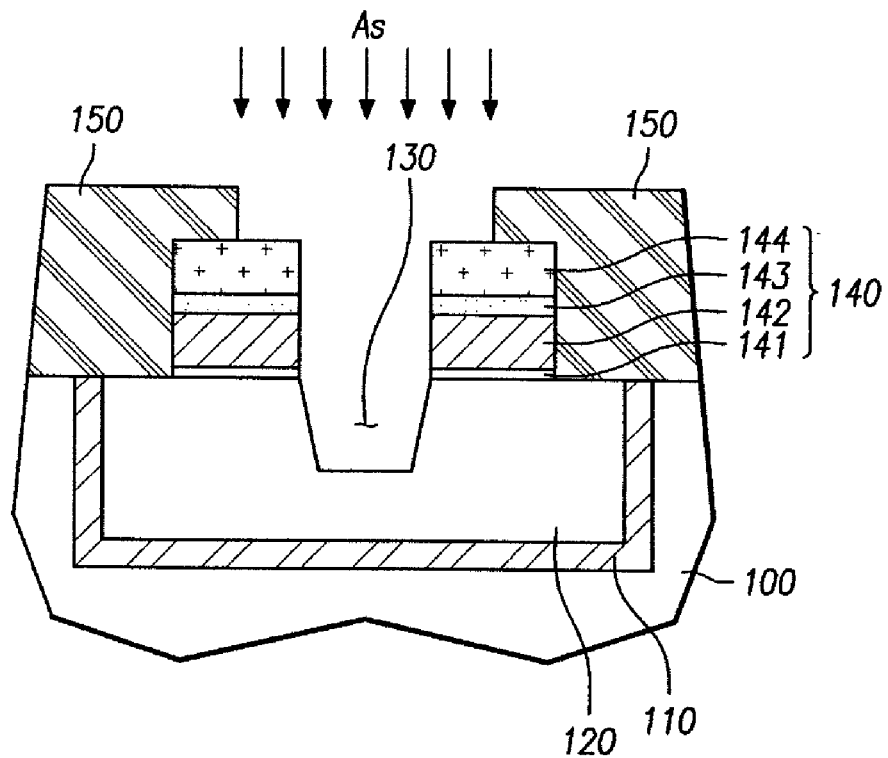
Figure 3D:
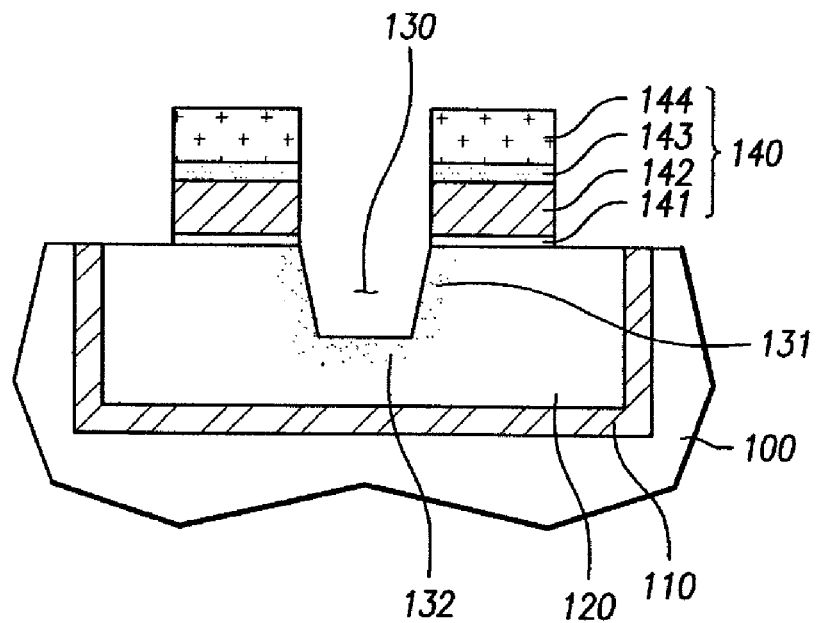

As shown in FIG. 3C, using the gate poly 140 as an etching mask, an etching process may be applied to the trench 130, thereby forming RCS (Recess Common Source) 131, 132 region in the trench 130 (S204). A photoresist pattern 150, which exposes the trench 130 corresponding to the common source region, is formed over the substrate 100 including the gate poly 140. The photoresist pattern 150 masks regions of the substrate except a common source line. If polysilicon formed as the control gate 144 is used in an etching mask, the oxide layer coated in the trench 130 may be removed. As shown in FIG. 3D, the trench 130 corresponds to the recess-shaped common source region, where the trench 130 is exposed.

Dopant ions may be implanted over an entire surface of the substrate 100 including the exposed trench 130, to form an impurity diffusion layer. In this way, the common source region RCS region 131 and 132 may be formed in the substrate (S205). P-type dopant such as As (arsenic) may be implanted to the surface 100. The impurity diffusion layer may electrically connect source diffusion regions.

An ashing process may be performed to the substrate 100 to remove the photoresist pattern 150 which remains over the substrate 100. For example, the ashing process may use plasma at a temperature of 250° C. generated by H2 gas at 8000 sccm, to remove the remaining photoresist pattern 150 from the substrate 100. After the ashing process, a cleaning process may be carried out.

After removing the photoresist pattern 150, an annealing process may be performed to stabilize the p-type dopant implanted to the common source region (S207). The annealing process may be performed to prevent the dopant from being lost by dopant out-diffusion. The dopant out-diffusion may occur in the lateral RCS region 131 of the common source region. Accordingly, the dopant which remains in the lateral RCS region may be stabilized by the annealing process. For example, if using an RTP (Rapid Thermal Process) method, the annealing process using $N_2$ gas may be maintained for 10 seconds at a temperature between 800° C. and 1050° C.

Referring to FIG. 4, the annealing process may be performed in the common source region, to stabilize the dopant. Accordingly, the loss of dopant in the semiconductor device may be decreased to 80% as compared with 90% of the related art loss of dopant. With this level of minimization in loss of dopant, the resistance value (Rs) of the common source region may be improved about 20% or more, thereby improving the reliability of semiconductor device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a trench in a semiconductor substrate;
   forming at least one poly gate in the semiconductor substrate including the trench;
   forming a recess common source region, wherein forming the recess common source region comprises: coating regions except the trench with photoresist; forming a pattern corresponding to the gate poly, and performing an etching process using the pattern as an etching mask; and removing the photoresist in the trench;
   implanting dopant ions into said recess common source region; and
   applying an annealing process to the recess common source region.

2. The method of claim 1, wherein the trench is formed by shallow trench isolation.

3. The method of claim 1, wherein the gate poly comprises a tunnel oxide layer.

4. The method of claim 1, wherein the gate poly comprises a floating gate.

5. The method of claim 1, wherein the gate poly comprises an oxide-nitride-oxide layer.

6. The method of claim 1, wherein the gate poly comprises a control gate.

7. The method of claim 1, wherein said removing the photoresist is performed by an ashing process using hydrogen plasma gas.

8. The method of claim 1, wherein said dopant ions comprise arsenic.

9. The method of claim 1, wherein the annealing process uses a rapid thermal process, and the annealing process uses nitrogen gas maintained at a temperature between about 800° C. and 1050° C.

* * * * *